US011845179B2

(12) United States Patent
Tan et al.

(10) Patent No.: US 11,845,179 B2
(45) Date of Patent: Dec. 19, 2023

(54) WAFER JIG, ROBOT SYSTEM, COMMUNICATION METHOD, AND ROBOT TEACHING METHOD

(71) Applicants:KAWASAKI JUKOGYO KABUSHIKI KAISHA, Kobe (JP); Kawasaki Robotics (USA), INC., Wixom, MI (US)

(72) Inventors: Haruhiko Tan, Kobe (JP); Hajime Nakahara, San Jose, CA (US)

(73) Assignees: KAWASAKI JUKOGYO KABUSHIKI KAISHA, Kobe (JP); Kawasaki Robotics (USA), INC., Wixom, MI (US)

( * ) Notice: Subject to any disclaimer, the term of this patent is extended or adjusted under 35 U.S.C. 154(b) by 486 days.

(21) Appl. No.: 17/131,082

(22) Filed: Dec. 22, 2020

(65) Prior Publication Data

US 2022/0193917 A1 Jun. 23, 2022

(51) Int. Cl.
| | | |
|---|---|---|
| B25J 11/00 | (2006.01) | |
| B25J 9/16 | (2006.01) | |
| B25J 13/08 | (2006.01) | |
| H01L 21/687 | (2006.01) | |
| B25J 15/06 | (2006.01) | |
| B25J 15/00 | (2006.01) | |

(52) U.S. Cl.
CPC ........... *B25J 11/0095* (2013.01); *B25J 9/163* (2013.01); *B25J 9/1664* (2013.01); *B25J 13/088* (2013.01); *B25J 15/0014* (2013.01); *B25J 15/0616* (2013.01); *H01L 21/68714* (2013.01)

(58) Field of Classification Search
CPC ...... B25J 11/0095; B25J 9/163; B25J 9/1664; B25J 13/088; B25J 15/0014; B25J 15/0616; H01L 21/68714; H01L 21/67259; H01L 21/6838; H01L 21/68707; H01L 21/67742
USPC ................. 700/245–264; 318/568.11–568.25
See application file for complete search history.

(56) References Cited

U.S. PATENT DOCUMENTS

| | | | | |
|---|---|---|---|---|
| 5,219,079 A * | 6/1993 | Nakamura | ........ | H01L 21/67309 211/41.18 |
| 6,453,214 B1 * | 9/2002 | Bacchi | ................ | H01L 21/6838 414/730 |
| 6,615,113 B2 * | 9/2003 | Kretz | ................ | H01L 21/67271 414/935 |
| 6,643,564 B2 * | 11/2003 | Kataoka | ............ | H01L 21/67259 414/730 |
| 6,678,581 B2 * | 1/2004 | Hung | ................ | H01L 21/68707 700/262 |

(Continued)

FOREIGN PATENT DOCUMENTS

| | | |
|---|---|---|
| JP | 2006-332543 A | 12/2006 |
| JP | 2010-137300 A | 6/2010 |

*Primary Examiner* — Jaime Figueroa
(74) *Attorney, Agent, or Firm* — METROLEX IP LAW GROUP, PLLC

(57) ABSTRACT

A wafer jig according to one or more embodiments may be used for a robot having a hand and a state detector. The hand can transport a wafer. The state detector detects a state of a member holding the wafer at the hand or a state of a negative pressure adsorbing the wafer at the hand. The wafer jig includes an information output part. The information output part outputs information to a hand side via the state detector by changing a detection result of the state detector.

9 Claims, 6 Drawing Sheets

(56) References Cited

U.S. PATENT DOCUMENTS

| | | | | |
|---|---|---|---|---|
| 6,813,543 | B2* | 11/2004 | Aalund | H01L 21/68707 700/250 |
| 7,140,655 | B2* | 11/2006 | Kesil | B25J 9/1633 414/941 |
| 7,706,919 | B2* | 4/2010 | Adachi | H01L 21/681 700/250 |
| 8,792,084 | B2* | 7/2014 | Shibazaki | H01L 21/67748 356/616 |
| 10,953,539 | B2* | 3/2021 | Yoshida | H01L 21/681 |
| 11,673,275 | B2* | 6/2023 | Rogers | B25J 13/089 901/30 |
| 2005/0034288 | A1* | 2/2005 | Adachi | H01L 21/67259 29/25.01 |
| 2005/0201424 | A1* | 9/2005 | Yoshida | G01S 17/42 372/9 |
| 2007/0273892 | A1* | 11/2007 | Asari | H01L 21/67757 356/614 |
| 2010/0296070 | A1* | 11/2010 | Shibazaki | G03F 7/707 355/53 |
| 2010/0297562 | A1* | 11/2010 | Shibazaki | G03F 7/70733 355/30 |
| 2011/0130864 | A1* | 6/2011 | Hirota | H01L 21/68707 901/3 |
| 2012/0290124 | A1* | 11/2012 | Kimura | H01L 21/67265 700/218 |
| 2016/0055425 | A1* | 2/2016 | Minami | G05B 19/425 706/12 |
| 2016/0240420 | A1* | 8/2016 | Wagenleitner | G01R 31/2887 |
| 2018/0117767 | A1* | 5/2018 | Yokota | B25J 15/0052 |
| 2019/0181027 | A1* | 6/2019 | Yoshida | H01L 21/67259 |
| 2019/0283217 | A1* | 9/2019 | Tanaka | B64U 70/00 |
| 2020/0168493 | A1* | 5/2020 | Sunugatov | H01L 21/67017 |
| 2020/0206917 | A1* | 7/2020 | Yoshida | G05B 19/42 |

* cited by examiner

SECOND EMBODIMENT

SECOND EMBODIMENT

WAFER JIG, ROBOT SYSTEM, COMMUNICATION METHOD, AND ROBOT TEACHING METHOD

TECHNICAL FIELD

The present invention relates to an use of a jig for a robot that handles a wafer.

BACKGROUND ART

Conventionally, a robot system for automatically teaching a conveying position of a semiconductor wafer to a robot arranged in a clean room where the semiconductor wafer (semiconductor substrate) is manufactured, the robot conveying the semiconductor wafer, has been known. The patent document 1 discloses a manipulator of this type of substrate transfer.

Patent Literature 1 (Japanese Patent Application Laid-Open No. 2010-137300, hereinafter, PTL 1) discloses this kind of a substrate transport manipulator. The substrate transport manipulator of PTL 1 includes a hand capable of holding a teaching jig and an arm portion for supporting the hand. In the substrate transport manipulator, a teaching jig transmission cable derived from the teaching jig is connected to a connector connection portion provided at the base end portion of the hand and introduced into the arm to be connected to a controller.

In the configuration of PTL 1, a posture of the teaching jig transmission cable is constantly maintained during the teaching. PTL 1 discloses that this can avoid a problem of damage of the jig or a peripheral device by the cable catching in the device.

SUMMARY OF THE INVENTION

Problems to be Solved by the Invention

In the configuration of PTL 1, in order to transmit an electrical signal, an electrical cable for connecting between the jig and the robot controller is required. Therefore, it is difficult to miniaturize the jig. The configuration that requires the electrical cable is not suitable for, for example, applications handing semiconductors having a low resistivity to generation of dust.

The present invention has been made in view of the circumstances described above, an object of the present invention is to provide a wafer jig that does not require a communication cable to communicate with a robot and a robot system that uses the wafer jig.

Means for Solving the Problems and Effects Thereof

Problems to be solved by the present invention are as described above, and next, means for solving the problems and effects thereof will be described.

According to a first aspect of the present invention, a wafer jig with the following configuration is provided. That is, the wafer jig is used for a robot having a hand and a state detector. The hand can transport a wafer. The state detector detects a state of a member holding the wafer at the hand or a state of a negative pressure adsorbing the wafer at the hand. The wafer jig includes an information output part. The information output part outputs information to a hand side via the state detector by changing a detection result of the state detector.

According to a second aspect of the present invention, the following communication method is provided. That is, in the communication method, between a robot and a wafer jig, the wafer jig transmits information to a hand side. The robot has a state detector detecting a state of a member holding a wafer at a hand capable of transporting the wafer or a state of a negative pressure adsorbing the wafer at the hand. The wafer jig can be held by the hand. The communication method includes a first step and a second step. In the first step, a state of keeping the wafer jig held by the hand is provided. In the second step, an information output part included in the wafer jig changes a detection result of the state detector depending on the information.

Accordingly, the wafer jig can communicate with the robot (thus, the control part for controlling the robot) by using a part of the configurations included in the robot (the state detector). Since the communication cable is not required, it is possible to realize miniaturization, simplification, and weight reduction of the wafer jig, and it is possible to suitably maintain flexibility of the movement of the robot.

Effects of Invention

According to the present invention, a wafer jig that does not require a communication cable to communication with the robot and a robot system that uses the wafer jig can be provided.

EMBODIMENT FOR CARRYING OUT THE INVENTION

Figure 1:
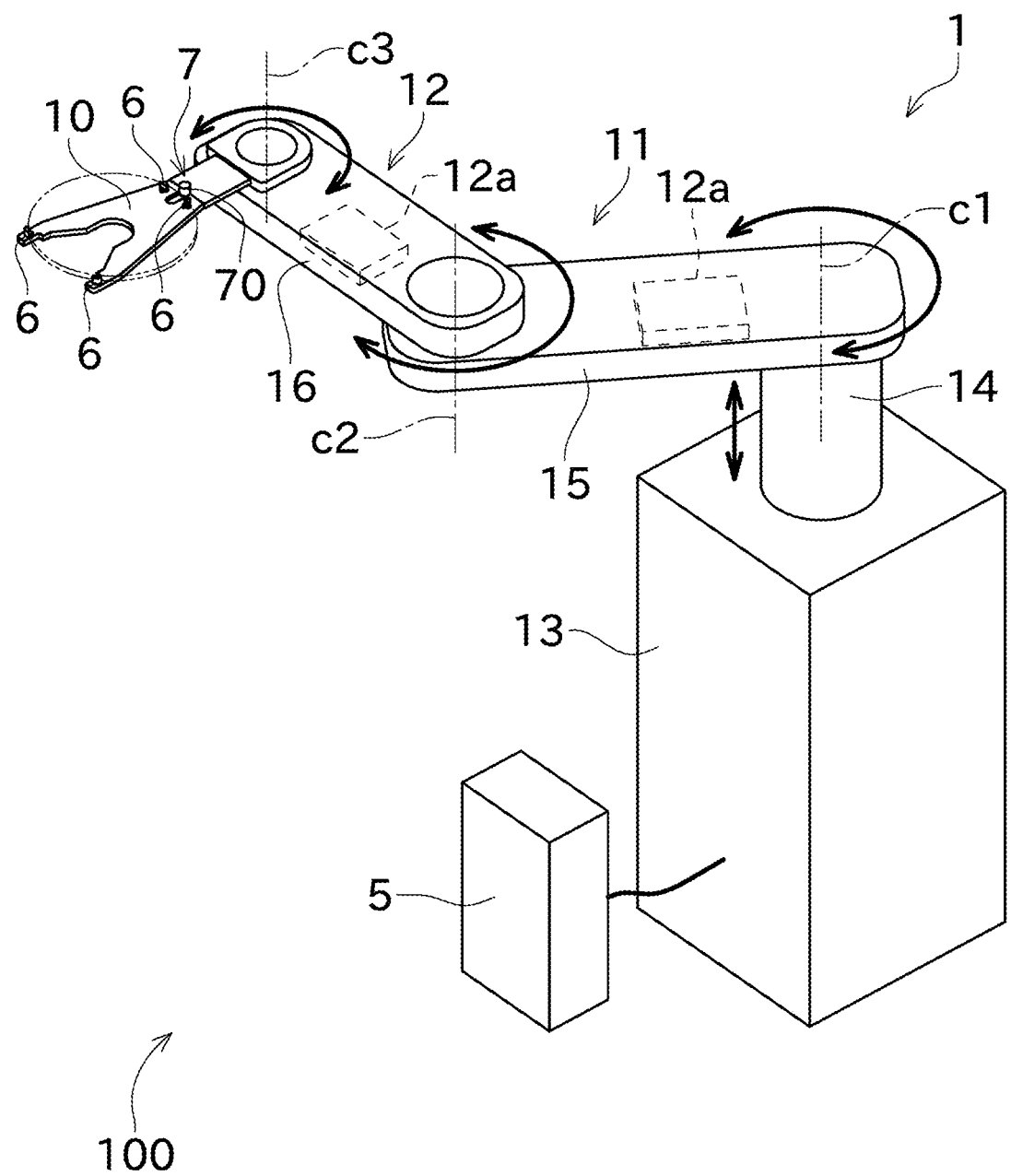
FIG. 1 is a perspective view showing a configuration of a robot system of the present invention.
Figure 2:
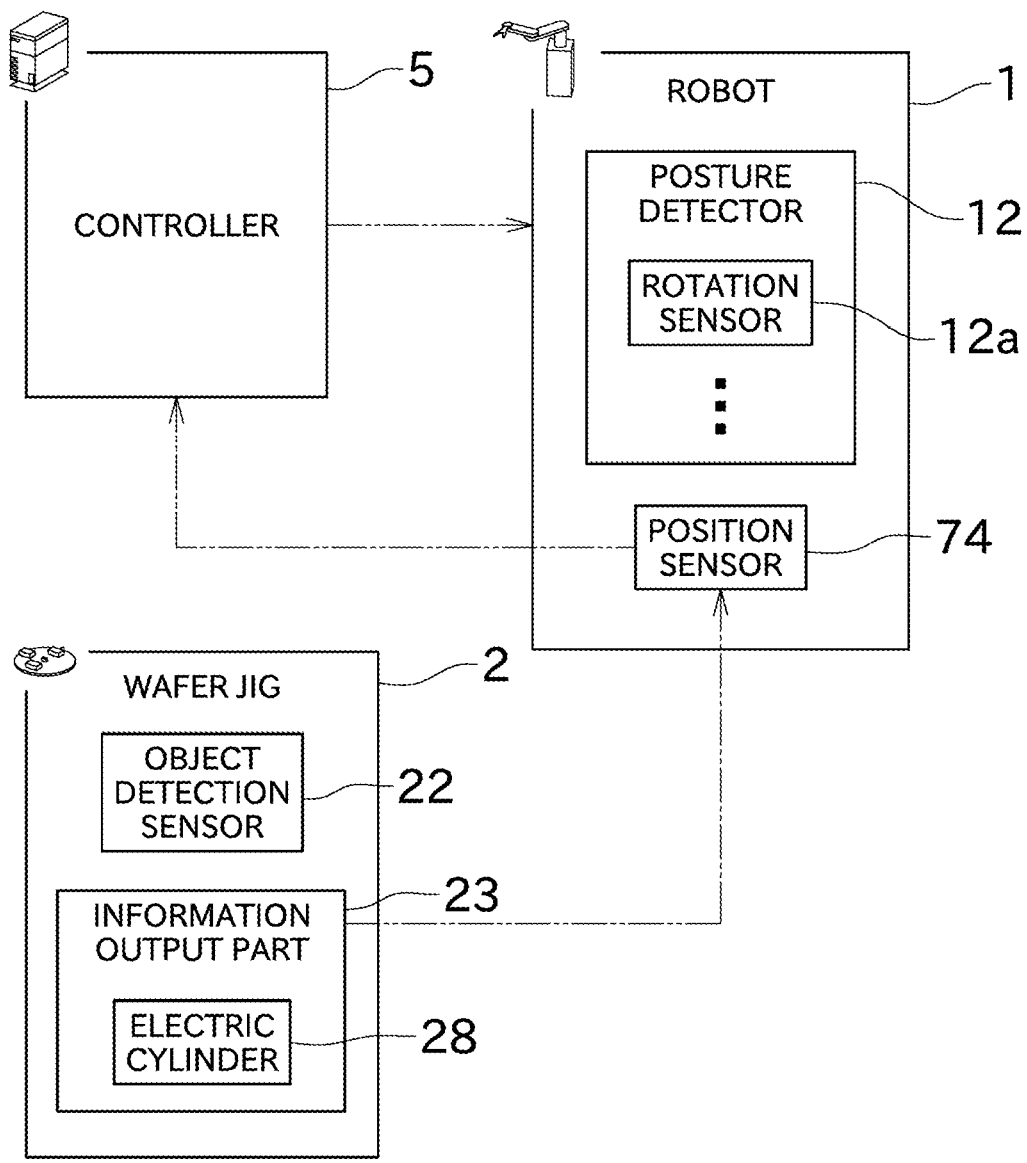
FIG. 2 is a block diagram showing a configuration of a part of a robot system.
Figure 3:
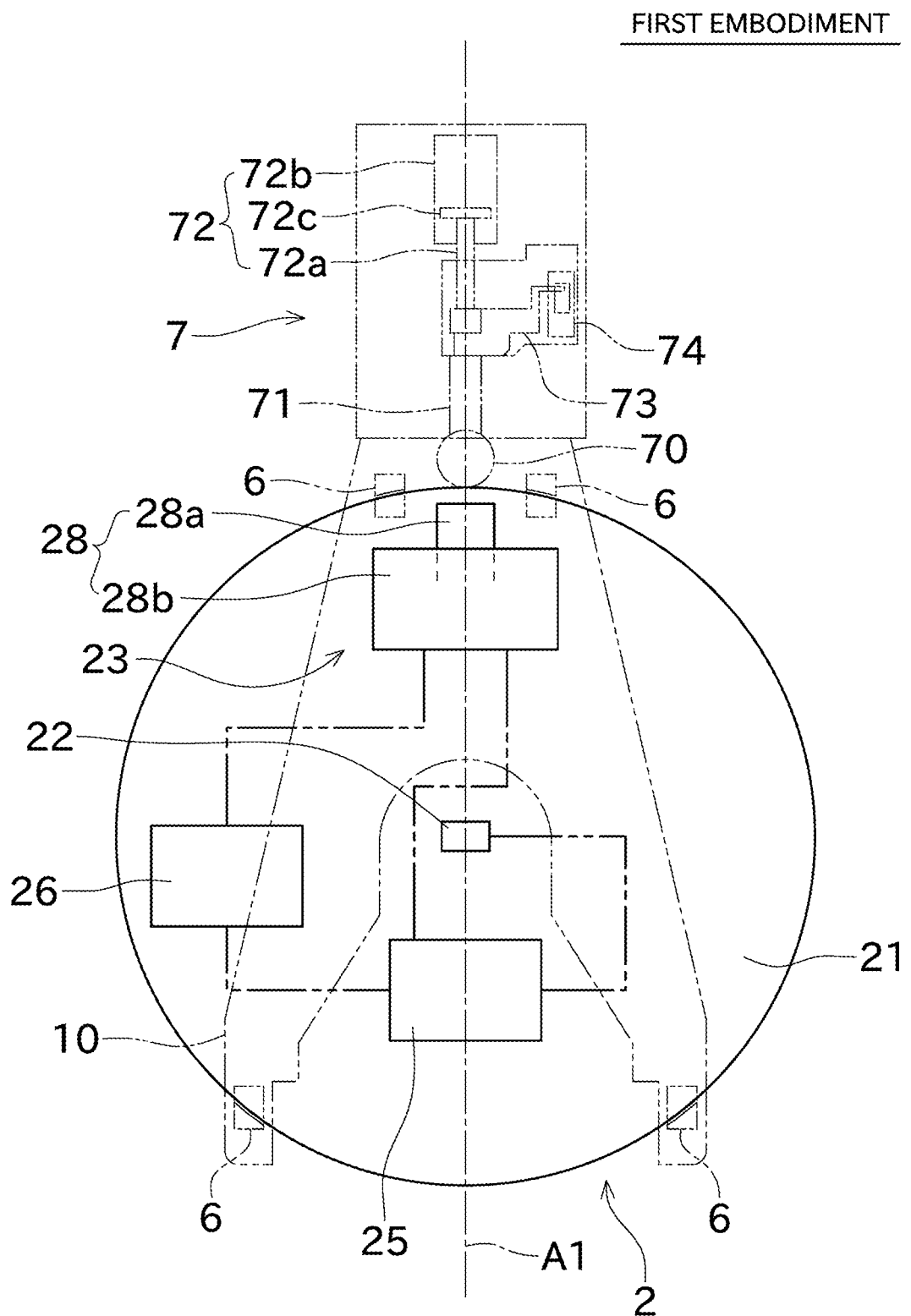
FIG. 3 is a plan view showing a configuration of a wafer jig of the first embodiment.
Figure 4:
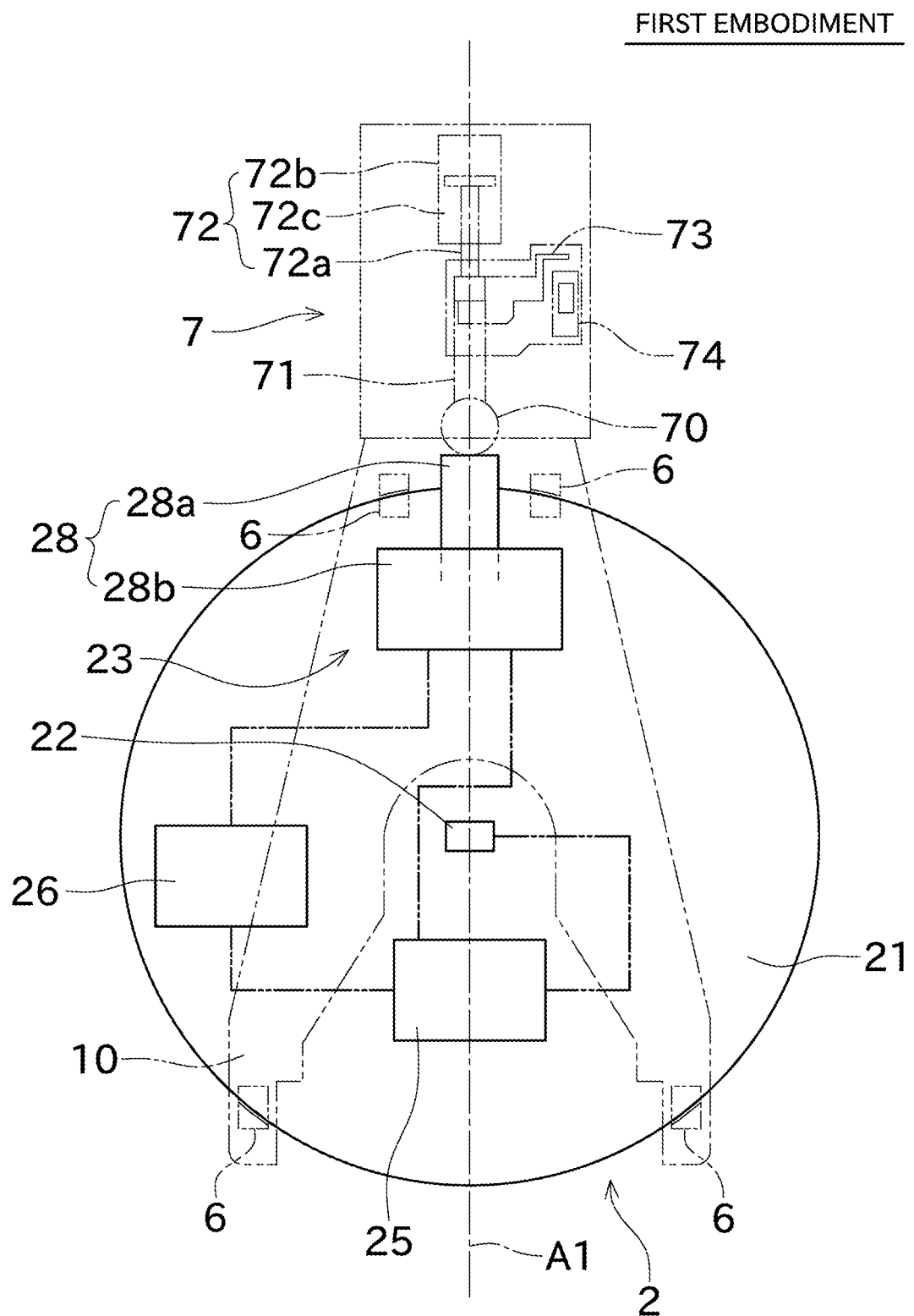
FIG. 4 is a plan view showing an electric cylinder forcefully retreats a pressing member from a state shown in FIG. 3.
Figure 5:
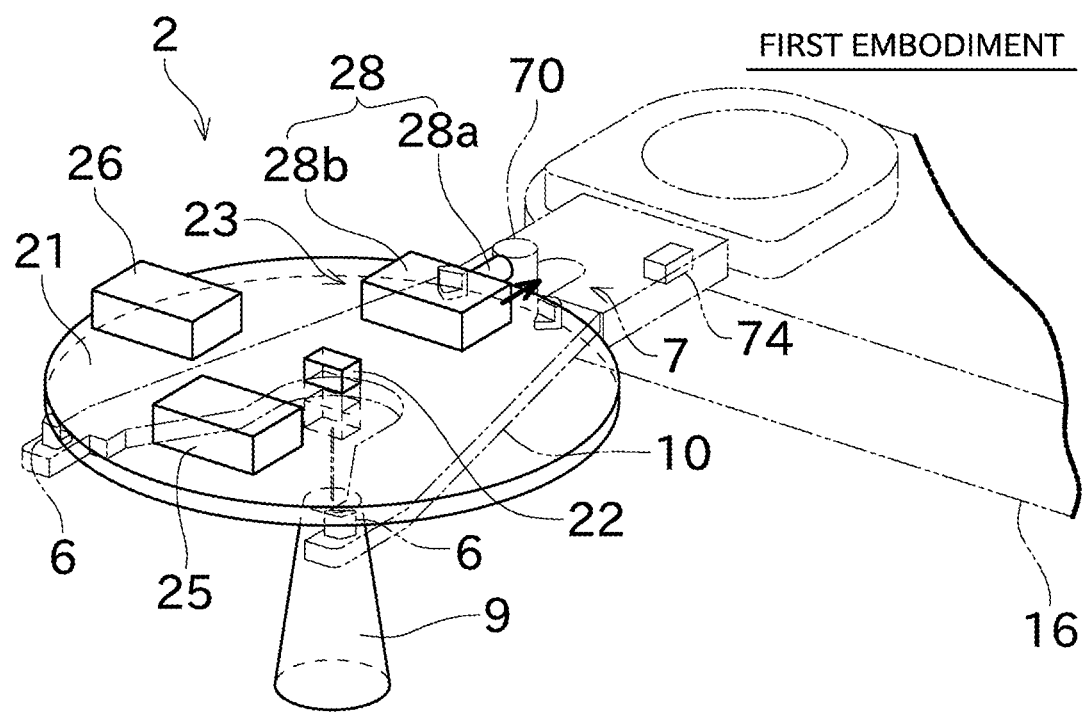
FIG. 5 is a partial perspective view showing a state of detecting the object by using the wafer jig of the first embodiment.

Next, an embodiment of the present invention will be described with reference to drawings. FIG. 1 is a perspective view showing a configuration of a robot system 100 of the present invention. FIG. 2 is a block diagram showing a configuration of a part of the robot system 100. FIG. 3 is a plan view showing a configuration of a wafer jig 2 of the first embodiment. FIG. 4 is a plan view showing an electric cylinder 28 forcefully retreats a pressing member 70 from a state shown in FIG. 3. FIG. 5 is a partial perspective view showing a state of detecting the object 9 by using the wafer jig 2 of the first embodiment.

The robot system 100 shown in FIG. 1 is a system that allows the robot 1 to perform work in a work space such as a clean room. The robot system 100 can perform an automatic teaching in which the position of the robot 1 (specifically, the position of the hand 10 which will be described later), for example, is efficiently and accurately taught.

The robot system 100 includes the robot 1, a wafer jig (communication jig) 2, and a controller (control part) 5.

The robot 1 functions as a wafer transfer robot for conveying a wafer (a work) stored in a storage container (not shown), for example. In this embodiment, the robot 1 is achieved by a SCARA type horizontal articulated robot. SCARA is an abbreviation for Selective Compliance Assembly Robot Arm.

As shown in FIG. 1, the robot 1 includes a hand (end effector) 10, a manipulator 11, and a posture detector 12.

The hand 10, which is a kind of end effector, is generally formed in a V-shape or a U-shape in a plan view. The hand 10 is supported by a tip of the manipulator 11 (specifically, a second link 16 which will be described later). The hand 10 rotates around a third axis c3 extending in the vertical direction with respect to the second link 16.

The hand 10 is configured as an edge-grip type hand. A plurality of edge guide parts 6 for holding the wafer are provided on each of the tip side and root side of the hand 10. The edge guide parts 6 are capable of contacting the outer peripheral surface of a disk-shaped wafer.

The hand 10 is equipped with a pressing mechanism 7. The pressure mechanism 7 is arranged on the root side of the hand 10. The pressure mechanism 7 contacts the outer peripheral surface of the wafer placed on the hand 10 and pushes the wafer toward the tip side of the hand 10. As a result, the pressing mechanism 7 can hold the wafer between itself and the edge guide part 6 on the tip side of the hand 10.

As shown in FIG. 3, the pressing mechanism 7 includes a pressing member 70, a transmission member 71, a pneumatic cylinder 72, a slide member 73, and a position sensor 74.

The pressing member 70 is a member that can contact the out peripheral surface of the wafer. The pressing member 70 is provided to be moveable along a symmetry axis A1 of the hand 10.

The transmission member 71 is connected to the pressing member 70. The transmission member 71 is formed elongated along the symmetry axis A1 of the hand 10. The transmission member 71 is arranged inside a hole or groove formed on the hand 10. The transmission member 71 connects the pressing member 70 to the pneumatic cylinder 72.

The pneumatic cylinder 72 drives the pressing member 70 via the transmission member 71. The pneumatic cylinder is a type of fluid pressure cylinder. Instead of the pneumatic cylinder 72, other linear motion actuators can be used.

The pneumatic cylinder 72 includes a rod 72a and a cylinder member 72b.

The rod 72a is arranged along the symmetry axis A1. The cylinder member 72b is formed in a hollow shape, and a piston 72c is arranged inside the cylinder member 72b. A part of the rod 72a is inserted into the cylinder member 72b, and an end of the rod 72a is connected to the piston 72c. An end of the rod 72a on the opposite side of the piston 72c is connected to the transmission member 71. The cylinder member 72b is connected to a compressed air source (not shown) via a pipe or the like arranged inside a manipulator 11. When compressed air is supplied to a cylinder chamber formed inside the cylinder member 72b, the rod 72a is driven to advance from the cylinder member 72b. As a result, the pressing member 70 can be displaced toward the tip of the hand 10.

The slide member 73 is installed at an appropriate position on the rod 72a or the transmission member 71. A guide member (not shown, e.g., a rail) is provided on the hand 10. The guide member guides a movement direction of the slide member 73. The slide member 73 can move along the symmetry axis A1 in conjunction with the movement of the rod 72a, the transmission member 71 and the pressing member 70.

The position sensor 74 can detect a position of the slide member 73. The position sensor 74 is electrically connected to the controller 5, and outputs a detected position information of the pressing member 70 to the controller 5. The position sensor 74 can be configured such that, for example, in a case that a predetermined position on the movable stroke of the slide member 73 is used as a boundary, to turn ON when the slide member 73 advances from the predetermined position to the tip side of the hand 10, and to turn OFF when the slide member 73 retreats from the tip of the hand 10 with respect to the predetermined position.

The position of the pressing member 70 changes depending on a switching of the pressing member 70 between an advance state and a retreat state. Therefore, it can be said that the position sensor 74 is a state detector detecting a state of the pressing member 70.

The manipulator 11 mainly includes a base 13, a lifting shaft 14, and a plurality of links (a first link 15 and the second link 16).

The base 13 is fixed to the ground (for example, a floor of the clean room). The base 13 functions as a base member that supports the lifting shaft 14.

The lifting shaft 14 moves in the vertical direction with respect to the base 13. With such lifting, the heights of the first link 15, the second link 16, and the hand 10 can be changed.

The first link 15 is supported on top of the lifting shaft 14. The first link 15 rotates around a first axis c1 extending in the vertical direction with respect to the lifting shaft 14. Accordingly, a posture of the first link 15 can be changed within a horizontal plane.

The second link 16 is supported by a tip of the first link 15. The second link 16 rotates around a second axis c2 extending in the vertical direction with respect to the first link 15. Accordingly, a posture of the second link 16 can be changed within the horizontal plane.

The posture detector 12 includes a plurality of rotation sensors 12a. For example, an encoder constitutes the rotation sensors 12a. Each rotation sensor 12a detects a rotation position of each drive motor (not shown) that drives the hand 10, the first link 15, and the second link 16, respectively. Each rotation sensor 12a is electrically connected to the controller 5 and transmits the detected rotation position to the controller 5.

The wafer jig 2 is a jig that imitates the wafer. The wafer jig 2 is formed in a substantially disk shape as a whole. As shown in FIG. 3, the wafer jig 2 includes a main body 21, an object detection sensor 22, and an information output part 23.

The main body 21 is formed in a circular flat plate shape. The diameter of the main body 21 is equal to the diameter of the wafer to be transferred by the robot 1. As long as the shape of the main body 21 substantially simulates the wafer, the material of the main body 21 need not be identical to the wafer.

The object detection sensor 22 is used to detect the object 9. The object detection sensor 22 is configured as a reflective sensor including a luminous part and a light receiving part, for example. The luminous part and the light receiving part of the object detection sensor 22 are provided at the lower portion of the main body 21 and at the center portion of the circular main body 21. The light axis of light emitted by the object detection sensor 22 is located at the central axis of the main body 21.

As shown in FIG. 5, the object 9 is formed in an elongated truncated cone shape, for example. The object 9 is arranged vertically at an appropriate location within the movable range of the hand 10. The surface of the upper end of the object 9 is formed to reflect light. A reflective sheet or the like may be attached to the upper surface of the object 9.

The information output part 23 is used to output information to the hand 10 side (i.e., the controller 5) via the pressing mechanism 7 provided on the hand 10.

In this embodiment, the information output part 23 includes an electric cylinder 28 which is a type of linear motion actuator. The electric cylinder 28 can be configured using, for example, a ball screw mechanism and an electric motor that drives a screw shaft. However, the configuration of the information output part 23 is not limited to this, for example, the information output part 23 also can be configured by a solenoid.

The electric cylinder 28 includes an output rod (forced retreating member) 28a and a cylinder member 28b.

The output rod 28a is configured as an elongated member. When the wafer jig 2 is held by the hand 10, the output rod 28a is arranged along the symmetry axis A1. At this time, a tip surface of the output rod 28a faces the above-mentioned pressing member 70 included by the hand 10.

An electric motor (not shown) is arranged in the cylinder member 28b. The electric motor operates with electrical power from a battery 26 which will be described later. The output rod 28a is driven to move in and out of the cylinder member 28b by the rotation of the electric motor. The moving direction of the output rod 28a is determined to be along the symmetry axis A1 of the hand 10 when the wafer jig 2 is held by the hand 10.

As shown in FIG. 3, the wafer jig 2 of this embodiment further includes an amplifier 25 and the battery 26.

The amplifier 25 is used to amplify a detection signal of the object detection sensor 22. The amplifier 25 is provided on the upper surface of the main body 21. The amplifier 25 is electrically connected to the object detection sensor 22 and the battery 26. The amplifier 25 operates with electrical power from the battery 26 and amplifies the detection signal received from the object detection sensor 22. The voltage of the amplified detection signal is compared to a predetermined voltage by a comparator (not shown). The comparator outputs the comparison result as an operation signal to the information output part 23.

The battery 26 provides power to the object detection sensor 22, the amplifier 25, the information output part 23, etc.

The electric motor of the electric cylinder 28 is driven in response to a change in a signal from the comparator, switching the output rod 28a between advance and retreat.

In the state of FIG. 3 where the output rod 28a is retraced, the pressing member 70 of the hand 10 contacts the outer peripheral surface of the body 21 of the wafer jig 2 to hold the wafer jig 2. Therefore, the position sensor 74 of the hand 10 is being in an ON state.

In the state of FIG. 4 where the output rod 28 is advancing, the output rod 28 forces the pressing member 70 to retreat against the pressure of the pneumatic cylinder 72. Therefore, the position sensor 74 of the hand 10 is being in an OFF state.

Therefore, the comparator substantially functions as an information output control part for controlling the electric motor of the information output part 23 (the electric cylinder 28) to realize the communication method of the present invention.

The wafer jig 2 configured as described above can communicate with the controller 5 via the pressing mechanism 7 provided in the hand 10. Details will be described later.

The controller 5 is configured as a known computer including a CPU, a ROM, a RAM, an auxiliary storage device, etc. The auxiliary storage device is configured as, for example, an HDD, an SSD, etc. The auxiliary storage device stores a robot control program, etc. for controlling the robot 1.

The controller 5 outputs a command value to each drive motor that drives each part of the above described robot 1 in accordance with a predetermined operation program, a movement command that is input from the user, or the like. The controller 5 controls to move the hand 10 to a predetermined command position.

Next, a robot teaching method will be described in detail. In the robot system 100 of this embodiment, the robot teaching method corrects the command position for the robot 1 based on the detection position of the hand 10 obtained from the detection result of the wafer jig 2 by the communication method of the present invention.

The wafer jig 2 is stored in an appropriate storage position when not in use. The robot 1 holds the wafer jig 2 stored in the storage position in response to a control command from the controller 5 (the first step). This state is shown in FIG. 3.

Before the wafer jig 2 is held by the hand 10, the output rod 28a of the electric cylinder 28 is in a retreated state at the information output part 23 of the wafer jig 2. The tip surface of the output rod 28a is located inside than the outer edge of the body 21. The pressing member 70 of the pressing mechanism advances to the tip side of the hand 10, contacting the body 21 and pressing it. In the state where the wafer jig 2 is held by the hand 10, the pressing member 70 moves to the advance side, and the position sensor 73 is being in the ON state.

The robot 1 transfers the held wafer jig 2 to a predetermined position. After transfer, the object detection sensor 22 of the wafer jig 2 is located at the vicinity of the object 9.

Thereafter, the robot 1 scans the object 9 by the object detection sensor 22 while moving the hand 10 together with the wafer jig 2 in various directions within a suitable range in a plan view. In this embodiment, the shape of the upper surface of the object 9 is circular. Therefore, the center of the circle can be specified by detecting the position of at least three points of the circle by using the object detection sensor 22. In this embodiment, in the plan view, the center of the circle of the upper surface of the object 9 is a reference position for position correction which will be described later.

In the course of the scanning, in the wafer jig 2, while the object 9 is detected by the object detection sensor 22, the electric motor of the electric cylinder 28 operates and the output rod 28a advances to the root side of the hand 10 as shown in FIG. 4 (second step). By the output rod 28a protruding from the outer edge of the body 21x, the pressing member 70 is pushed toward the retreat side as shown by the thick arrow in FIG. 5. As a result, the position sensor 74 is switched from the ON state to the OFF state. Therefore, the controller 5 to recognize whether the object detection sensor 22 detects the object 9 or not through the position sensor 74.

Due to the tolerance or the like of the robot 1, a displacement may occur between the position of the hand 10 commanded to the robot 1 and the actual position of the hand

10. According to this embodiment, the displacement can be specified based on the result of scanning the object 9 by the wafer jig 2, and the command position for the robot 1 can be corrected.

The following is a brief description about that. The controller 5 stores the command position for the robot 1 in advance corresponding to each of the three points which is acquired by the detection of the object 9 by using the object detection sensor 22. The controller 5 calculates the command position corresponding to the center of the circle passing through the three command positions in a known manner. If there is a displacement between the command position calculated in this way and the command position previously used for coinciding the center of the hand 10 with the center of the object 9, the controller 5 obtains the displacement amount by calculation. The displacement amount can be represented by a plane vector, for example. The controller 5 corrects the offset of the command position by subtracting the vector of the displacement amount from the original command position. The command position after correction given to the robot 1 by the controller 5 enable the robot 1 to improve the operation accuracy.

Since the wafer jig 2 is shaped like the wafer, the hand 10 can handle the wafer jig 2 in the same manner as an ordinary wafer. Therefore, it is easy to automatically perform a series of operations of the above described scanning and position correction.

The wafer jig 2 notifies the controller 5 via the position sensor 74 of the pressing mechanism 7 that the object 9 is detected by the object detection sensor 22. In this way, since information is transmitted by optical communication, electrical cables is not required. Accordingly, it is possible to realize simplification and weight reduction of the configuration. Since the electrical cable is not required, it is possible to suppress generation of dust. Furthermore, since the configuration uses the pressing mechanism 7 which robots often includes conventionally, it is easy to apply to the existing robots.

As described above, the wafer jig 2 of this embodiment is used for robot 1 having the hand 10 and the position sensor 74. The hand 10 can transport the wafer. The position sensor 74 detects the state of the pressing member 70 holding the wafer in the hand 10. The wafer jig 2 includes the information output part 23 for outputting information to the hand 10 side. The information output part 23 outputs information to the hand 10 side via the position sensor 74 by changing the detection result of the position sensor 74.

Accordingly, the wafer jig 2 can communicate with the robot 1 by using a part of the configuration included in the robot 1 (the pressing mechanism 7). Since the communication cable is not required, it is possible to realize miniaturization, simplification, and weight reduction of the wafer jig 2, and it is possible to suitably maintain flexibility of the movement of the robot 1.

The wafer jig 2 of this embodiment includes the object detection sensor 22 for detecting the object 9. The information output part 23 outputs information whether the object detection sensor 22 detects the object 9 or not.

Accordingly, the detection result whether the object 9 is detected at the wafer jig 2 side is recognized at the robot 1 side.

In this embodiment, the object detection sensor 22 is provided at the center of the wafer jig 2.

Accordingly, since the object 9 is detected based on the position corresponding to the center of the wafer jig 2, it is possible to accurately grasp the position of the wafer jig 2 detected the object 9.

In this embodiment, in a state where the wafer jig 2 is held by the hand 10, the object detection sensor 22 is located at the center of the hand 10.

Accordingly, it is possible to obtain a detection result at the center position of the hand 10. The center position of the hand 10 is often used as a reference for position control. Therefore, for example, by using the detection result for position control, it is possible to improve the operation accuracy of the robot 1.

In the wafer jig 2 of this embodiment, the hand 10 includes the pressing member 70 that presses the wafer.

Accordingly, it is possible to transmit information from the wafer jig 2 side with a simple configuration.

In the wafer jig 2 of this embodiment, the information output part 23 outputs information by movements of the electric cylinder.

Accordingly, for example, it is possible to perform communication with the controller 5 using the electric power supplied from the battery without connecting the pipe from the compressed air source to the wafer jig 2. Therefore, the wafer jig 2 can be easily handled.

Figure 6A:
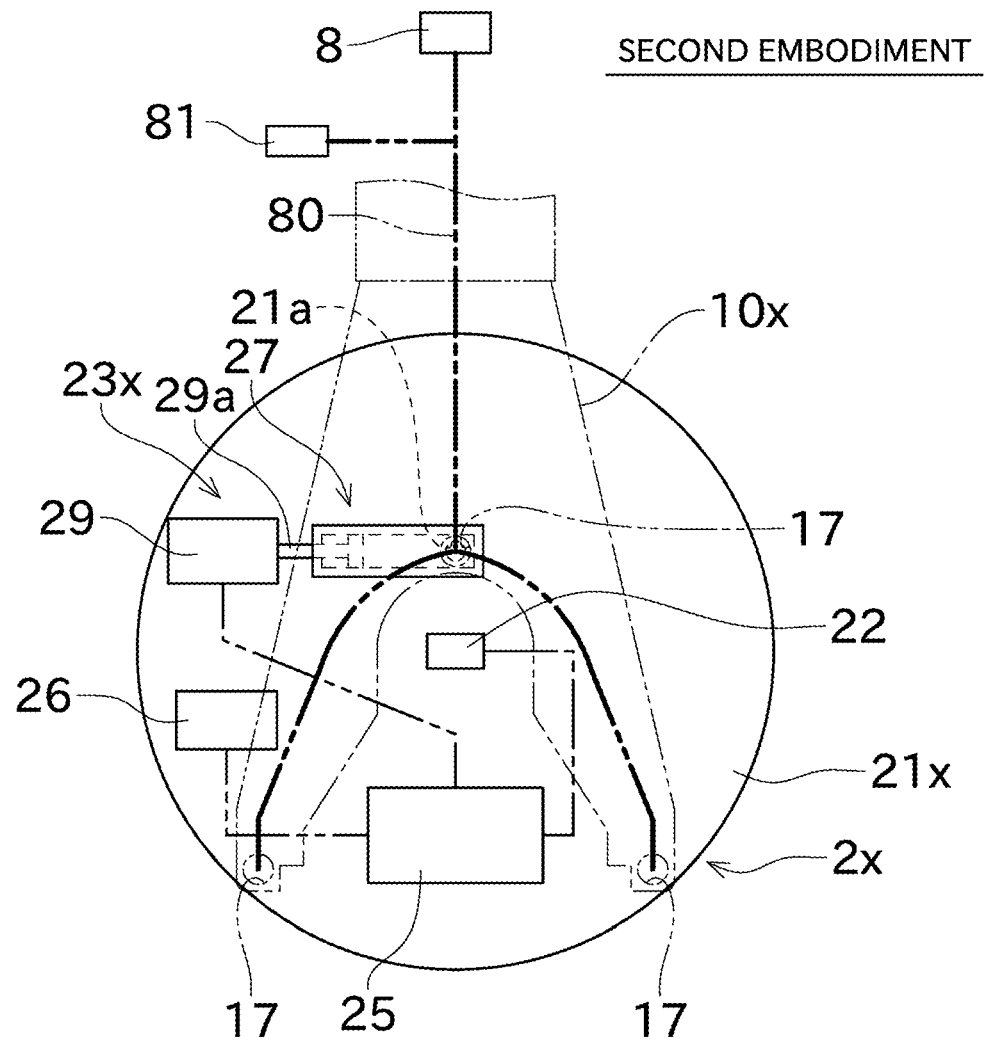
FIG. 6A is a plan view showing a configuration of a wafer jig of the second embodiment.
Figure 6B:
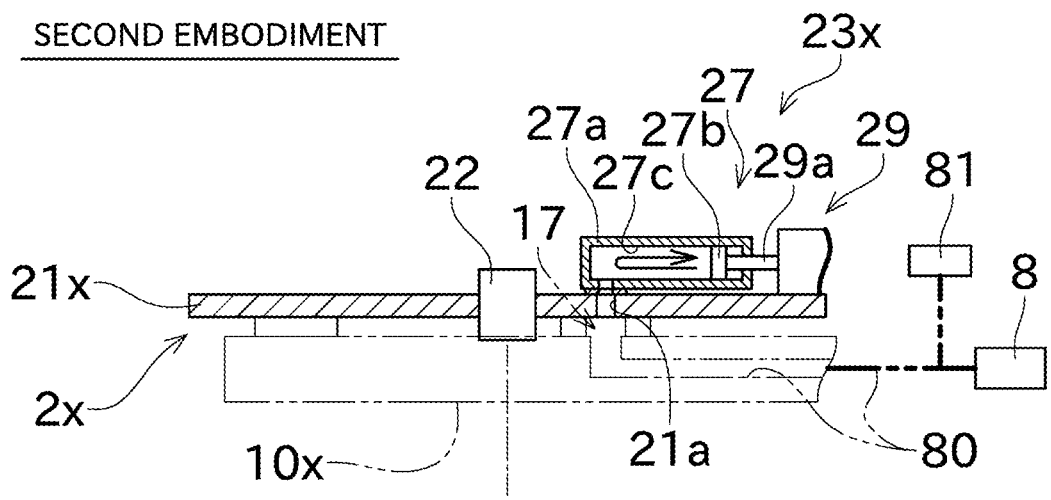
FIG. 6B is a partial cross section schematic diagram showing a configuration of the wafer jig of the second embodiment.

Next, the second embodiment will be described. FIG. 6A is a plan view showing the configuration of the wafer jig 2x of the second embodiment. FIG. 6B is a partial cross section schematic diagram showing the configuration of the wafer jig 2x of the second embodiment. In the description of this embodiment, members identical or similar to those of the above described embodiment may not be described and instead the same reference signs as in the above described embodiment are given on the drawings.

The robot of this embodiment includes a suction grip type hand 10x. As shown in FIG. 6A, a plurality (three in this embodiment) of suction ports 17 for adsorbing the wafer to hold it are formed on the hand 10x. Each of the suction ports 17 is connected to the negative pressure source 8 via a negative pressure flow path (path) 80. A negative sensor 81 is connected on the negative pressure flow path 80.

The negative sensor 81 is configured as a pressure sensor for negative pressure. The negative sensor 81 is electrically connected to the controller 5, and transmits the detected pressure to the controller 5. The negative sensor 81 is a type of the state detector that detects the negative state at which the hand 10x adsorbs the wafer.

The wafer jig 2x includes a body 21x. A through hole 21a is formed in the body 21x.

The through hole 21a is provided at a position corresponding to one of the three suction ports 17. Specifically, the through hole 21a is formed corresponding to the suction port 17 on the side near the wrist of the hand 10x. As shown in FIG. 6B, an internal space of the suction port 17 is connected to an internal space of the through hole 21a when the wafer jig 2x is held by the hand 10x.

The wafer jig 2x includes the information output part 23x. The information output part 23x includes a pneumatic cylinder 27 and a electric cylinder (actuator) 29.

As shown in FIG. 6B, the pneumatic cylinder 27 includes a hollow-shaped cylinder member 27a. A piston 27b is configured to be able to move in the axial direction inside the cylinder member 27a. The internal space of the cylinder member 27a is divided into two parts by the piston 27b. The connecting cavity 27c which is a space partitioned on one side is connected to the through hole 21a described above.

The electric cylinder 29 can be configured by using, for example, a ball screw mechanism and an electric motor. The tip of the rod 29a of the electric cylinder 29 is inserted into the cylinder member 27a of the pneumatic cylinder 27 and fixed to the piston 27b.

In this configuration, the suction port 17 is connected to the connecting cavity 27c while the hand 10x holds the wafer jig 2x.

The robot 1 scans the object 9 by the object detection sensor 22 while moving the hand 10x together with the wafer jig 2x in various directions within a suitable range in a plan view. When the object 9 is detected by the object detection sensor 22, the electric cylinder 29 is driven to make the piston 27b in the cylinder 27 back and forth with an appropriate stroke. As a result, the volume of the connecting cavity 27c changes, so that the negative pressure of the negative pressure flow path 80 becomes stronger or weaker. The negative pressure sensor 81 detects this pressure change. In this way, the controller 5 can recognize whether or not the object 9 is detected by the object detection sensor 22 through the negative pressure sensor 81.

As described above, in this embodiment, the suction port 17 capable of sucking the wafer is formed on the hand 10x. The robot 1 includes the negative pressure sensor 81 that detects the negative pressure in the path connecting the suction port 17 and the negative pressure source. The wafer jig 2x includes the connecting cavity 27c which is connected with the suction port 17 when the wafer jig 2x is sucked by the hand 10x. The information output part 23x of the wafer jig 2x includes the electric cylinder 29 changes the volume of the connecting cavity 27c.

Accordingly, it is possible to transmit the information from the wafer jig 2x to the controller 5 using the negative pressure for sucking the wafer.

While the preferred embodiment of the present invention have been described above, the above configuration can be changed, for example, as follows.

The object detection sensor 22 may be a non-contact type sensor or a contact type sensor.

The wafer jig 2, 2x may be used for purposes other than the detection of the object 9, 9x (in other words, the purpose other than the position correction of the robot 1).

The battery 26 may be configured as a primary battery or as a secondary battery. When the battery 26 is configured as a secondary battery, it is preferable that a charging device for charging the battery 26 is arranged in the storage position of the wafer jig 2 or another position. Thus, automatic charging can be realized.

DESCRIPTION OF THE REFERENCE NUMERALS

1 robot
2, 2x wafer jig
5 controller (control part)
8 negative pressure source
9 object
10, 10x hand
17 suction port
22 object detection sensor
23, 23x information output part
27c connecting cavity
28 electric cylinder (actuator, electric actuator)
29 electric cylinder (actuator, electric actuator)
70 pressing member
74 position sensor (state detector)
81 negative pressure sensor (state detector)
100 robot system

The invention claimed is:

1. A wafer jig comprising:
an information output part comprising an actuator for outputting information to a robot having a hand capable of transporting a wafer and a state detector detecting a state of a member capable of holding the wafer at the hand, wherein
the information output part outputs information to the state detector by changing a detection result of the state detector;
the hand includes a pressing member that presses the wafer,
the state detector is a position sensor that detects a position of the pressing member, and
the actuator contacts and changes a position of the pressing member.

2. The wafer jig according to claim 1, further comprising:
an object detection sensor detecting an object, wherein
the information output part outputs whether the object detection sensor detected the object or not as the information.

3. The wafer jig according to claim 2, wherein
the object detection sensor is provided at a center of the wafer jig.

4. The wafer jig according to claim 3, wherein
in a state where the wafer jig is held by the hand, the object detection sensor is located at a center of the hand.

5. A wafer jig comprising:
an information output part comprising an actuator for outputting information to a robot having a hand capable of transporting a wafer and a state detector detecting a state of a negative pressure adsorbing the wafer at the hand, wherein
the information output part outputs information to the state detector by changing a detection result of the state detector
a suction port capable of sucking the wafer is formed on the hand,
the state detector is a negative pressure sensor that detects a negative pressure in a path connecting the suction port and a negative pressure source,
the wafer jig includes a connecting cavity which is connected with the suction port when the wafer jig is sucked by the hand, and
the actuator changes a volume of the connecting cavity.

6. The wafer jig according to claim 1, wherein
the actuator of the information output part comprises an electric actuator that outputs the information by movements thereof.

7. A robot system comprising:
the wafer jig according to claim 1;
a robot capable of holding the wafer jig by the hand; and
a controller controlling the robot by giving commands to the robot, wherein
the controller receives information from the wafer jig side via the state detector.

8. A communication method for transmitting information from a wafer jig to a robot, the robot having a state detector detecting a state of a member capable of holding a wafer at a hand capable of transporting the wafer, the wafer jig being capable of being held by the hand, the communication method comprising:
holding the wafer jig by the hand; and
actuating an information output part comprising an actuator included in the wafer jig to change a detection result of the state detector depending on the information, wherein
the hand includes a pressing member that presses the wafer jig, the state detector comprises a position sensor that detects a position of the pressing member, and changing a detection result of the state detector comprises contacting, by the actuator, the pressing member to change a position thereof.

9. A robot teaching method by using the communication method according to claim 8, wherein a command position of the robot is corrected based on the information obtained from the wafer jig.

* * * * *